(12) United States Patent
Garrity

(10) Patent No.: US 10,193,534 B2
(45) Date of Patent: Jan. 29, 2019

(54) WIRELESS POWER SYSTEM TUNING APPARATUS

(71) Applicant: Garrity Power Services LLC, Rockwall, TX (US)

(72) Inventor: Paul Garrity, Rockwall, TX (US)

(73) Assignee: Garrity Power Services LLC, Rockwall, TX (US)

( * ) Notice: Subject to any disclaimer, the term of this patent is extended or adjusted under 35 U.S.C. 154(b) by 0 days.

(21) Appl. No.: 15/372,165

(22) Filed: Dec. 7, 2016

(65) Prior Publication Data
US 2017/0179933 A1    Jun. 22, 2017

Related U.S. Application Data

(60) Provisional application No. 62/268,918, filed on Dec. 17, 2015.

(51) Int. Cl.
| | |
|---|---|
| H03J 3/20 | (2006.01) |
| H02J 50/12 | (2016.01) |
| H01F 38/14 | (2006.01) |
| H01F 21/08 | (2006.01) |
| H03J 3/00 | (2006.01) |

(52) U.S. Cl.
CPC .............. *H03J 3/20* (2013.01); *H01F 21/08* (2013.01); *H01F 38/14* (2013.01); *H02J 50/12* (2016.02); *H03J 3/00* (2013.01); *H03J 2200/06* (2013.01)

(58) Field of Classification Search
CPC .............................. H03J 3/20; H03J 2200/06
See application file for complete search history.

(56) References Cited

U.S. PATENT DOCUMENTS

| | | | | |
|---|---|---|---|---|
| 6,317,021 B1 * | 11/2001 | Jansen | ................... | H01F 27/24 336/155 |
| 8,723,368 B2 * | 5/2014 | Choudhary | .......... | H04B 5/0081 307/104 |
| 2010/0254168 A1 * | 10/2010 | Chandrasekaran | ....... | H01F 3/10 363/37 |
| 2011/0101790 A1 * | 5/2011 | Budgett | ................. | H02J 50/12 307/104 |
| 2011/0248812 A1 * | 10/2011 | Hu | ......................... | H01F 29/14 336/221 |
| 2011/0285210 A1 * | 11/2011 | Lemmens | ............... | H02J 5/005 307/104 |
| 2013/0049918 A1 * | 2/2013 | Fu | ............................. | H01F 3/12 336/220 |

(Continued)

FOREIGN PATENT DOCUMENTS

| | | | |
|---|---|---|---|
| CN | 102956344 A | * 3/2013 | |
| WO | WO 9960585 A1 | * 11/1999 | ............. H01F 27/24 |

OTHER PUBLICATIONS

Clarke,"Magnetic Properties of Material," 2008, pp. 1-19.*

(Continued)

*Primary Examiner* — Thienvu Tran
*Assistant Examiner* — Pinping Sun
(74) *Attorney, Agent, or Firm* — Hovey Williams LLP

(57) ABSTRACT

A wireless power transmission system comprising a wireless transmitter capable of transmitting power and a wireless receiver capable of receiving power such that the transmitter or receiver comprises a controller and resonant tank, and the resonant tank comprises a capacitor and an electrically tunable inductor.

15 Claims, 8 Drawing Sheets

(56) References Cited

U.S. PATENT DOCUMENTS

| | | | | |
|---|---|---|---|---|
| 2015/0051750 A1* | 2/2015 | Kurs | ................... | G05F 1/625 |
| | | | | 700/298 |
| 2017/0077737 A1* | 3/2017 | Hsieh | ................... | H02J 7/025 |
| 2017/0154725 A1* | 6/2017 | Clavijo | ................... | H01F 27/40 |
| 2017/0331379 A1* | 11/2017 | Mao | ................... | H02M 3/3376 |

OTHER PUBLICATIONS

Hyperphysics, "Faraday's Law," 2010, pp. 1-4.*
Texas Instructments, "Magnetic Core Characteristics," 2001, pp. 1-9.*
Kislovski,"Relative Incremental Permeability of Soft Ferrites as a function of the magnetic field H: An analytic approximation," Power electronics Specialists Conference, 1996, pp. 1469-1475.*
Law dictionary,"Piece-parr" definition,pp. 1.*
Merriam-Webster,"other" definition, pp. 1.*

\* cited by examiner

WIRELESS POWER SYSTEM TUNING APPARATUS

RELATED APPLICATIONS

This patent application claims priority benefit to a provisional patent application titled "Wireless Power System Tuning Apparatus" U.S. Application No. 62/268,918, filed Dec. 17, 2015, incorporated by reference herein in its entirety.

TECHNICAL FIELD

The present invention is directed, in general, to wireless power transmission and, more specifically, to a wireless power system and method of operating the same.

BACKGROUND

Wireless transmission of power typically performed with a magnetic device such as a transformer has been known in the industry for many decades and first demonstrated by Nicola Tesla over one hundred years ago. Tesla used a very high voltage across a coil or winding to light a lamp several feet away. Wireless power systems disclosed many decades ago suffered from many limitations, foremost of which was very poor coupling between the transmitting and receiving coil of the transformer. In recent years, wireless power systems have been developed that use resonant operation to boost the coupling between transmitting and receiving coils.

The standard modern wireless power system uses two planar coils (also referred to as "windings"), one coil for the power transmitter and one coil for the power receiver. Power transfer is maximized by adjusting the transmitting frequency to system resonance or by adjusting system resonance to a fixed transmitting frequency. In many applications, transmitting frequency must be fixed or remain within tight limits for various reasons, so the system resonance must then be adjusted by changing system resonance.

The standard method of adjusting system resonance is to use semiconductor switches to place capacitors into or out of the resonant tank. The resulting switched capacitor architecture is expensive both due to the expensive semiconductor switches required to switch the capacitors into and out of the circuit, and the capacitors themselves, if placed onto the substrate of an integrated circuit can also add cost to the integrated circuit. Furthermore, the switched capacitor architecture allows for only a few limited number of steps in capacitance value, thus making it impossible to tune exactly to resonance.

SUMMARY OF THE INVENTION

These and other problems are generally solved or circumvented, and technical advantages are generally achieved, by advantageous embodiments of the present invention, including a wireless power system and methods of operating and forming the same. In one embodiment, the wireless power system comprises a wireless transmitter capable of transmitting power and a wireless receiver capable of receiving power such that the transmitter or receiver comprises a controller and resonant tank, and the resonant tank comprises a capacitor and an electrically tunable inductor. The controller may adjust an inductance of the electrically tunable inductor to adjust a resonance of the resonant tank. In a further embodiment, the electrically tunable inductor comprises a magnetic core that further comprises two magnetic loops such that each of a power winding and a control winding equally link each of the two loops. In a still further embodiment, the ratio of the number of turns of the control winding to the power winding is greater than 10.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different FIGUREs generally refer to corresponding parts unless otherwise indicated, and may not be redescribed in the interest of brevity after the first instance. The FIGUREs are drawn to illustrate the relevant aspects of exemplary embodiments.

DETAILED DESCRIPTION OF ILLUSTRATIVE EMBODIMENTS

The making and using of the present exemplary embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a wireless power system, and methods of operating and forming the same. While the principles of the present invention will be described in the environment of a wireless power system, any application that may benefit from wireless transfer of power is well within the broad scope of the present invention. Additionally, while the principles of the present invention will be described with respect to electronic devices (also referred to as a "load") such as cell phones, tablets, and power tools, other applications such as motor controllers and amplifiers are well within the broad scope of the present invention.

Figure 1:
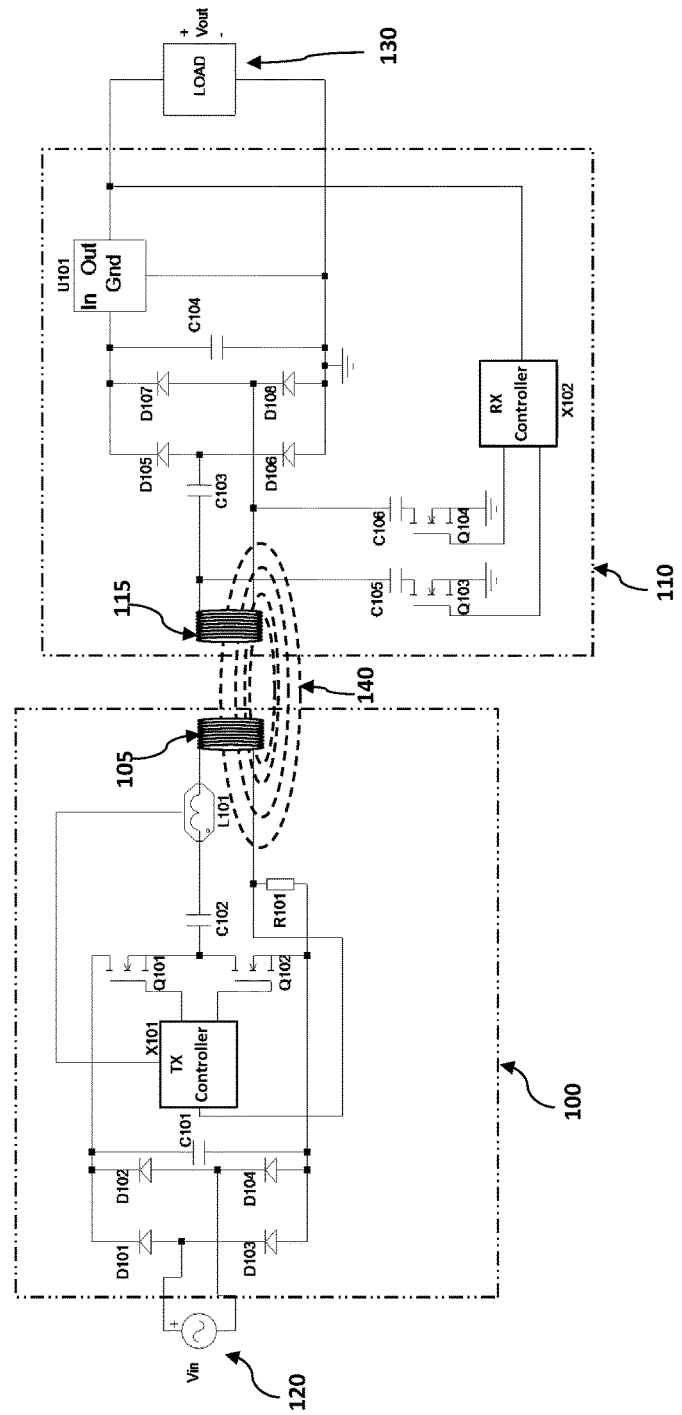
FIG. 1 is a simplified schematic diagram of a wireless power system with a power transmitter and a power receiver and a resonant tank comprising a tunable inductor, constructed in accordance with an embodiment of the invention.

Turning now to FIG. 1, illustrated is a schematic diagram of an embodiment of a wireless power system with Power Transmitter 100 and Power Receiver 110. Power Transmitter 100 wirelessly transmits power to Power Receiver 110 by inductively coupling Coils 105 and 115 through Inductive Coupling Path 140.

Transmitter 100 receives power from Utility Grid 120. The utility grid power is rectified by diodes D101, D102, D103, and D104 and then filtered by capacitor C101 to provide a direct current (DC) power source. This DC source is provided to a half-bridge comprising MOSFETs Q101 and Q102. Controller X101 switches MOSFETs Q101 and Q102 in a complementary way—that is at any given time, one of the two MOSFETs is on, other than a short dead-time to prevent simultaneous conduction of the two MOSFETs. Q101 and Q102 are operated at slightly less than 50% duty cycle.

L101 is a tunable inductor. That is, the inductance of component L101 can change in response to a control signal. Capacitor C102 is a resonant capacitor and Coil 105 is a transmitting coil. Resistor R101 is used to sense current flow in Coil 105.

Receiver 110 receives power from transmitter 100 by inductive coupling through coil 115. Capacitor C103 is a resonant capacitor. Diodes D105, D106, D107, and D108 rectify the voltage across coil 115 which is then filtered by capacitor C104. Linear regulator U101 then regulates the voltage to Load 130.

C105, C106, Q103, and Q104 are used to modulate the power drawn by the receiver in a process known as back-scatter modulation in order to provide a method of communication from the receiver to the transmitter.

There is a resonant tank formed by a combination of transmitter and receiver components, as well as by the coupling between the transmitter and receiver. The resonant tank comprises C102, L101, C103, and parasitic inductance and capacitance of Transmitting Coil 105, Receiving Coil 115, and the coupling there between.

To maximize power transfer between the transmitter and receiver, it is necessary to operate the transmitter at the system resonance. Since the coupling between the coils changes with the relative positions of the receiver and transmitter, the resonant frequency of the resonant tank will change as the receiver is moved relative to the transmitter. Furthermore, tolerance of components in production will cause some variance in resonant frequency from one device to another. It is therefore necessary to adjust either a resonant component or a switching frequency of the resonant tank in order to maximize power transfer between the transmitter and receiver.

Controller X101 can adjust a current through tunable inductor L101 to tune the system to resonance. It should be noted that inductor L101 could have been located in the receiver instead of the transmitter and the function been similar since the system resonant tank incorporates components in both the transmitter and the receiver.

Controller X101 increases or decreases the inductance of tunable inductor 101 in order to maximize the voltage across receiving coil. Back-scatter modulation communicates information of the receiving coil voltage back to the transmitter. If increasing the inductance of L101 causes the receiving coil voltage to increase, then the transmitter should try to further increase the inductance of L101. Whereas if increasing the inductance of L101 causes the receiving coil voltage to decrease, then the transmitter needs to decrease the inductance of L101. Similarly, if decreasing the inductance of L101 causes the receiving coil voltage to increase, then the transmitter should try to further decrease the inductance of L101, and if decreasing the inductance of L101 causes the receiving coil voltage to decrease, then the transmitter needs to increase the inductance of L101. Thus, controller X101 is able to keep the system in resonance by constantly adjusting the inductance of tunable inductor L101.

Figure 2:
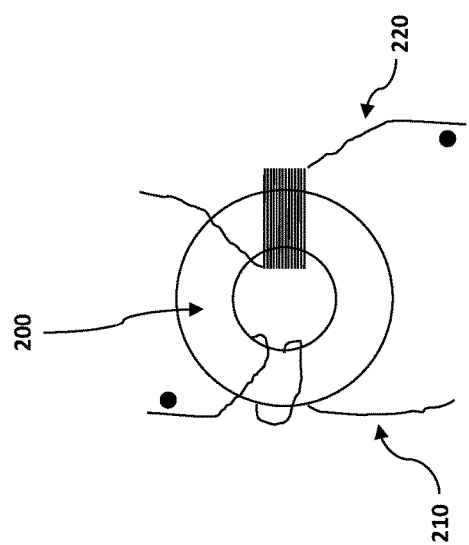
FIG. 2 is a plan view of a tunable inductor constructed in accordance with another embodiment of the invention.
Figure 3:
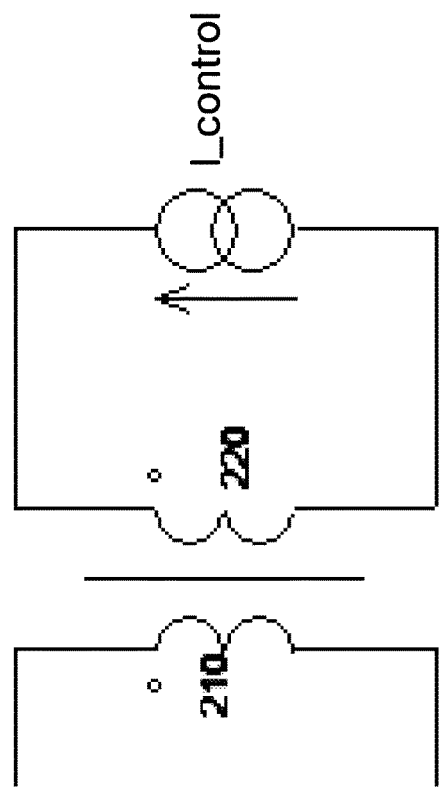
FIG. 3 is a simplified schematic diagram of the tunable inductor of FIG. 2 controlled by a current source.

FIG. 2 shows a simplified mechanical model of an embodiment of a tunable inductor and FIG. 3 shows a simplified schematic of the inductor shown in FIG. 2. Power Coil 210 and Control Coil 220 are each wound on Magnetic Core 200. Magnetic Core 200 is shown as a toroid; however, the core could be any shape that allows for Control Coil 220 and Power Coil 210 to be wound on it such as a U-U core, a pot core, or any number of core shapes such as are known in the art. Power Coil 210 is typically composed of a small number of windings such as 1 to 5 turns, and Control Coil 220 is preferably wound with small wire and has at least 10 times and preferably at least 20 times as many turns as the power coil in order to minimize the control current needed to tune the inductance. As shown in the schematic of FIG. 3, Power Coil 210 and Control Coil 220 form a transformer. The terminals of Power Coil 210 represent the two terminals of the inductor and the terminals of Control Coil 220 are used for controlling the inductance. A DC current source $I_{control}$ can be used to control the inductance.

Figure 4:
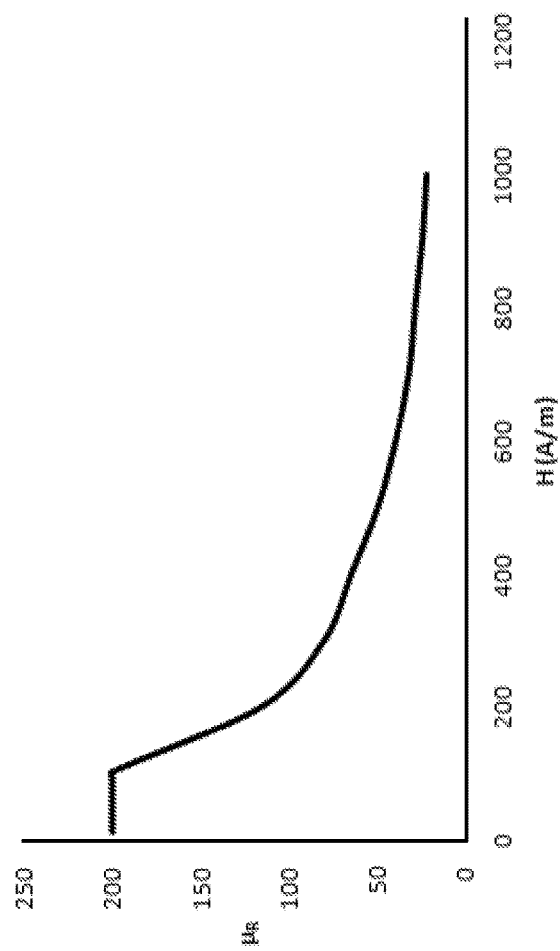
FIG. 4 is a graph of a magnetic curve of an example magnetic material used in a tunable inductor.

FIG. 4 shows a magnetic curve for the magnetic material of core 200. The plot in FIG. 4 shows the relative permeability $\mu_R$ versus the magnetic field intensity H. As can be seen, $\mu_R$ remains constant for low values of H (below 100 A/m). Above 100 A/m, $\mu_R$ decreases, at first linearly, and then decreases more gradually. The inductance L as seen across the terminals of Power Coil 210 in the inductor of FIG. 2 is $$L = \frac{\mu_R \mu_0 N_{210}^2 A}{l}$$

where $\mu_R$ is the relatively permeability of the core material, $\mu_0$ is the permeability of free space, $N_{210}$ is the number of turns of Power Coil 210, A is the cross-sectional area of Power Coil 210, and l is the magnetic path length of the core. Since $\mu_0$, $N_{210}$, A, and l are all fixed in value, the inductance is equal to a constant times relative permeability $\mu_R$. Thus the inductance of the tunable inductor of FIG. 2 can be changed by changing the value of $\mu_R$.

If a constant DC current $I_{control}$ is placed into Control Coil 220, the magnetic field intensity gets a constant DC bias equal to $H_{DC}$ where $$H_{DC} = \frac{\mu_0 N_{220} I_{control}}{l}$$

Figure 5:
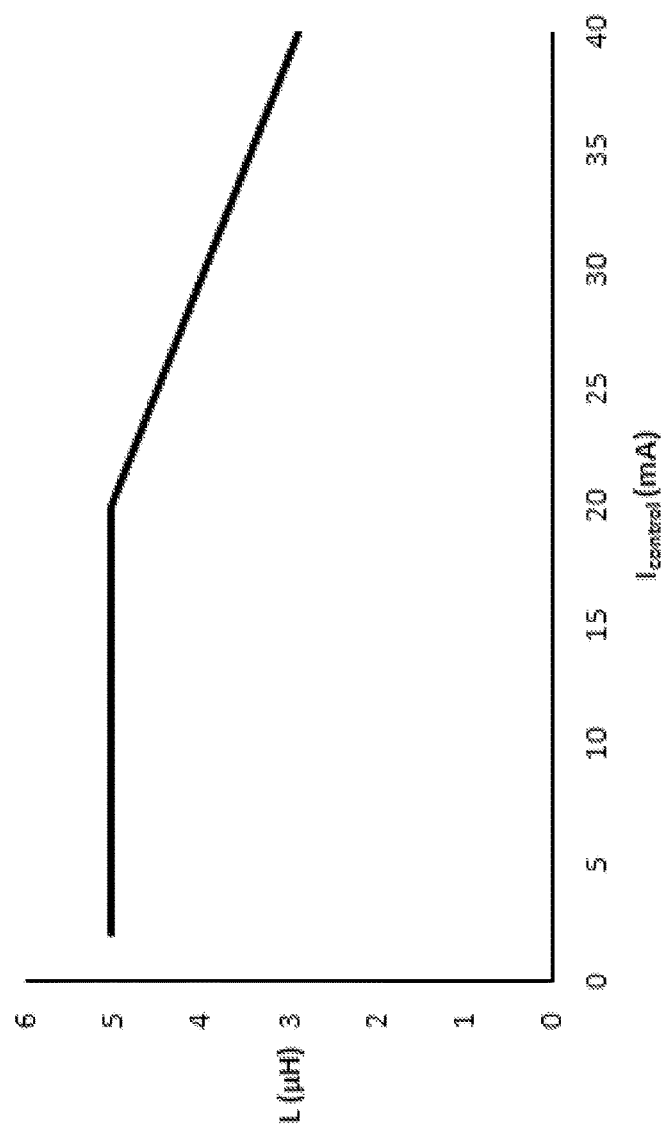
FIG. 5 is a graph of an inductance curve of a tunable inductor.

Thus, as $I_{control}$ is increased, $H_{DC}$ is increased and $\mu_R$ decreases according to the curve shown in FIG. 4. If the control current is used in the linear region of the $\mu_R$ versus H curve, the resulting inductance versus control current is shown in FIG. 5. As is shown in FIG. 5, only a small control current is needed to adjust the inductance of the tunable inductor. The control current; however, must be large enough to reach the knee of the curve in order to change the inductance value. For the example shown in FIG. 5, the control current would be a nominal value of 20 mA and would be increased from 20 mA as high as 40 mA to linearly decrease the inductance value from 5 µH to 3 µH. The example shown is for a nickel-zinc ferrite core. An advantage of a nickel-zinc ferrite core is the linear decrease of relative permeability with respect to magnetic field intensity over a reasonably large range of magnetic field intensity. Of course, the values shown are examples only. Many other numbers of turns, core materials, or inductance values could be used.

A drawback of the tunable inductor shown in FIG. 2 is the large voltage that is generated across the control winding. For example, a typical voltage across Power Coil 210 would be on the order of 100V. If the control winding has 10 times as many turns as the power winding, then the voltage across the control winding would be on the order of 1000V. Clearly, it is impractical to control such a device. The issue of the high control voltage is solved in the embodiments described in FIGS. 6, 7, and 8.

Figure 6:
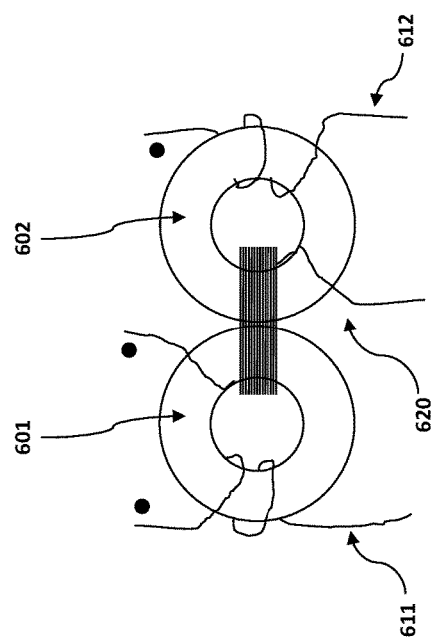
FIG. 6 is a plan view of another tunable inductor.

Turning now to FIG. 6, illustrated is another embodiment of a tunable inductor. Power Coil 611 and Control Coil 620 are wound onto Magnetic Toroid Core 601. Control Coil 620 is also wound through Magnetic Toroid Core 602, and Power Coil 612 is wound through Magnetic Core 602. Thus the control link is wound onto both cores and separate power coils are wound onto one core each. The key to operating the inductor in FIG. 6 is to operate the coils in such a way that the voltage across the control winding is close to zero.

Figure 7:
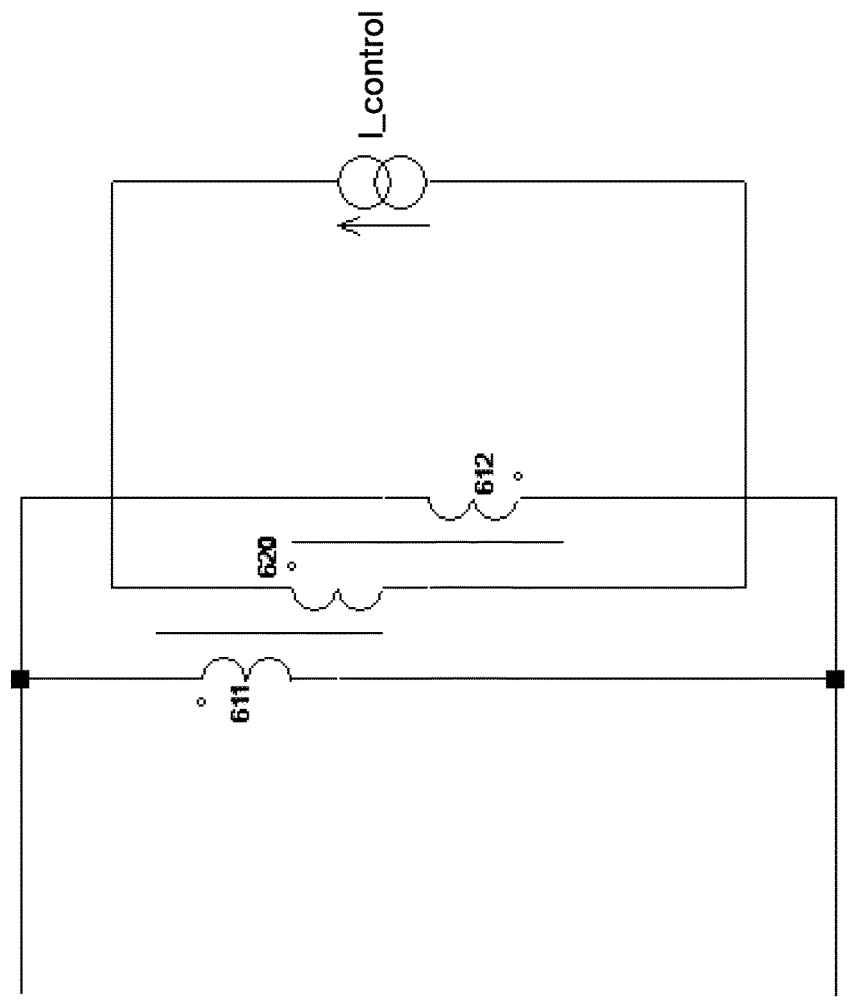
FIG. 7 is a simplified schematic diagram of the tunable inductor shown in FIG. 6.

FIG. 7 shows an equivalent circuit for the inductor shown in FIG. 6 when that inductor is controlled with a current source. Control Coil 620 is coupled to both Power Coils 611 and 612. Note that Power Coils 611 and 612 are wired in anti-parallel. That is, the dotted end of Power Coil 611 is connected to the non-dotted end of Power Coil 612 and the dotted end of Power Coil 612 is connected to the non-dotted end of Power Coil 611. A DC current is placed into Control Winding 620. The voltage induced across Control Winding 620 by Power Coil 611 is equal and opposite to the voltage induced across Control Winding 620 by Power Coil 612. The net voltage across Control Winding 620 must therefore remain at 0V.

Other than the cancelling of the voltage across the control coil, the tunable inductor embodiment of FIG. 6 functions identically to that of the tunable inductor embodiment in FIG. 2. Thus, the equations and theory of operation already described apply equally well to the embodiment shown in FIG. 6, with the exception of the zeroed voltage across the control coil.

Figure 8:
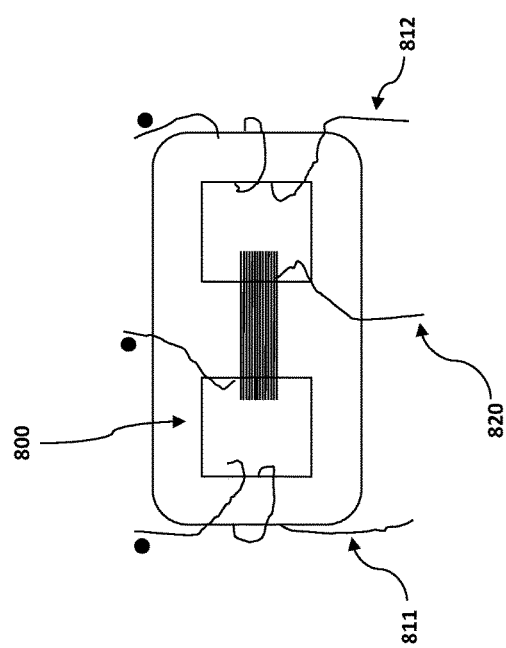
FIG. 8 is a plan view of an embodiment of a tunable inductor constructed in accordance with another embodiment of the invention.

Magnetically, the example shown in FIG. 6 is similar to the example shown in FIG. 8. In FIG. 8, Power Coil 811 is wound onto an outer leg of E-E Core 800. Power Coil 812 is wound onto the other outer leg of E-E Core 800. Control Coil 820 is wound onto the center leg of Core 800. The operation of inductors in FIGS. 6 and 8 are identical, so the theory of operation of the inductor in FIG. 8 is not repeated here and can be inferred from the theory of operation of the inductor in FIG. 6, substituting Power Coil 811 for Power Coil 611, Power Coil 812 for Power Coil 612, Control Coil 820 for Control Coil 620, and Core 800 for a combination of Cores 601 and 602.

Thus, improvements to a wireless power system have been introduced that provide cost and performance advantages by using a tunable inductor to accurately and inexpensively tune a wireless system to resonance. In one embodiment, a wireless power system (also referred to as a "system") comprises a wireless transmitter (Transmitter 100 in FIG. 1) capable of transmitting power and a wireless receiver (Receiver 110 in FIG. 1) capable of receiving power such that the transmitter or receiver comprises a controller (X101) and resonant tank, and the resonant tank comprises a capacitor (C102 or C103) and an electrically tunable inductor (L101).

In a further embodiment, the tunable inductor comprises a magnetic core comprising a first (Magnetic Toroid Core 601 in FIG. 6) and second magnetic loop (Magnetic Toroid Core 602 in FIG. 6), a control winding (Control Winding 620 in FIG. 6), a first power winding (Power Winding 611 in FIG. 6), and a second power winding (Power Winding 612 in FIG. 6). The control winding links the first and second magnetic loop, the first power winding links the first magnetic loop, and the second power winding links the second magnetic loop. The first power winding and second power winding are connected in parallel in such a way as to cancel any induced voltage in the control winding.

Other effective alternatives will occur to a person skilled in the art. Those skilled in the art should understand that the previously described embodiments of the wireless power system and related methods of operating the same are submitted for illustrative purposes only. In addition, various power converter topologies are well within the broad scope of the present invention. While the power transmitter and power receiver have been described in the environment of a bridge topology, it may also be applied to other systems such as, without limitation, a power amplifier and a motor controller.

For a better understanding of power converters, see "Modern DC-to-DC Power Switch-mode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:
1. A wireless power transmission system comprising:
   a wireless transmitter capable of transmitting power; and
   a wireless receiver capable of receiving power such that the transmitter or the receiver comprises a controller and a resonant tank, and the resonant tank comprises a capacitor and an electrically tunable inductor including a control coil, the controller being configured to adjust a current in the control coil to adjust the inductance of the electrically tunable inductor, the controller being further configured to produce a constant value of the current in the control coil to produce a desired inductance of the electrically tunable inductor.

2. The wireless power transmission system of claim 1, wherein the controller is configured to adjust an inductance of the electrically tunable inductor to adjust a resonance of the resonant tank.

3. The wireless power transmission system of claim 2, wherein the controller is configured to adjust the resonance of the resonant tank in such a way as to adjust a transfer of power between the transmitter and the receiver.

4. The wireless power transmission system of claim 2, wherein the controller is configured to adjust the resonance of the resonant tank in such a way as to maximize the transfer of power between the transmitter and the receiver.

5. The wireless power transmission system of claim 1, wherein the electrically tunable inductor further comprises a power coil.

6. The wireless power transmission system of claim 5, wherein the electrically tunable inductor comprises a magnetic core.

7. The wireless power transmission system of claim 6, wherein the magnetic core comprises a material which decreases in permeability as magnetic field intensity increases.

8. The wireless power transmission system of claim 6, further comprising a second power coil, wherein the magnetic core comprises two magnetic core loops such that the control coil links the two magnetic core loops, the power coil links only one of the two magnetic core loops, and the second power coil links the other of the two magnetic core loops.

9. The wireless power transmission system of claim 8, wherein the power coil and the second power coil are wired in parallel in such a direction that no net voltage is induced across the control coil.

10. The wireless power transmission system of claim 8, wherein each of the two magnetic core loops comprises a separate magnetic core piece.

11. The wireless power transmission system of claim 8, wherein the magnetic core comprises three distinct core legs.

12. The wireless power transmission system of claim 6, wherein the magnetic core comprises a Nickel-Zinc ferrite.

13. The wireless power transmission system of claim 5, wherein a ratio of a number of turns in the control coil to a number of turns in the power coil is greater than or equal to 10.

14. The wireless power transmission system of claim 1, wherein the transmitter comprises the electrically tunable inductor.

15. The wireless power transmission system of claim 1, wherein the receiver comprises the electrically tunable inductor.

* * * * *